(12) United States Patent
Goetz

(10) Patent No.: US 11,909,234 B2
(45) Date of Patent: Feb. 20, 2024

(54) RECHARGING CIRCUIT FOR MODULAR MULTILEVEL CONVERTERS

(71) Applicant: Dr. Ing. h.c. F. Porsche Aktiengesellschaft, Stuttgart (DE)

(72) Inventor: Stefan Goetz, Forstem (DE)

(73) Assignee: Dr. Ing. h. c. F. Porsche AG, Stuttgart (DE)

( * ) Notice: Subject to any disclaimer, the term of this patent is extended or adjusted under 35 U.S.C. 154(b) by 1061 days.

(21) Appl. No.: 16/634,298

(22) PCT Filed: Mar. 1, 2018

(86) PCT No.: PCT/EP2018/025054
§ 371 (c)(1),
(2) Date: Jan. 27, 2020

(87) PCT Pub. No.: WO2019/020215
PCT Pub. Date: Jan. 31, 2019

(65) Prior Publication Data
US 2023/0198513 A1 Jun. 22, 2023

(30) Foreign Application Priority Data
Jul. 27, 2017 (DE) .................... 10 2017 117 031.6

(51) Int. Cl.
*H02J 7/00* (2006.01)
*H02J 7/34* (2006.01)
(Continued)

(52) U.S. Cl.
CPC ............ *H02J 7/0024* (2013.01); *H02J 7/345* (2013.01); *H03K 17/063* (2013.01); *H02M 1/08* (2013.01);
(Continued)

(58) Field of Classification Search
CPC ........ H02J 7/345; H02J 7/0024; H02J 7/0072; H03K 17/063; H03K 2217/008; H03K 2217/0081
(Continued)

(56) References Cited

U.S. PATENT DOCUMENTS 5,373,435 A 12/1994 Jayaraman et al.
8,558,586 B1 * 10/2013 Martin ............... H03K 17/6871
327/108
(Continued)

FOREIGN PATENT DOCUMENTS

DE 101 03 031 12/2011
DE 10 2013 217 173 3/2014
KR 10-2017-0034270 3/2017

OTHER PUBLICATIONS

S. M. Goetz, A. V. Peterchev and T. Weyh, "Modular Multilevel Converter With Series and Parallel Module Connectivity: Topology and Control," in IEEE Transactions on Power Electronics, vol. 30, No. 1, pp. 203-215, Jan. 2015.
(Continued)

*Primary Examiner* — Edward Tso
*Assistant Examiner* — Aaron Piggush
(74) *Attorney, Agent, or Firm* — Gerald E. Hespos; Michael J. Porco

(57) ABSTRACT

The present invention relates to a method for recharging an energy store (102) used to drive a power semiconductor switch (100), wherein the energy store (102) and the power semiconductor switch (100) are at the same potential, wherein a switching state of the power semiconductor switch (100) is effected by a controller (204, 712), wherein the controller (204) assigns a respective potential value to the energy store (102) at a respective switching state (202) and wherein, by driving at least one charging switch (112, 114, 122, 132, 142, 152), charging of the energy store (102)
(Continued)

is activated as soon as the potential value of the energy store (102) corresponds to a ground potential of a supply voltage (106, 216).

14 Claims, 5 Drawing Sheets

(51) Int. Cl.
  *H03K 17/06* (2006.01)
  *H02M 1/08* (2006.01)
  *H02M 7/483* (2007.01)
(52) U.S. Cl.
  CPC ..... *H02M 7/483* (2013.01); *H03K 2217/0081* (2013.01)
(58) Field of Classification Search
  USPC ......... 320/107, 108, 141, 158, 166; 327/108
  See application file for complete search history.

(56) References Cited

U.S. PATENT DOCUMENTS

| | | | |
|---|---|---|---|
| 2008/0100378 A1* | 5/2008 | Bernacchia | H02M 7/5388 |
| | | | 327/589 |
| 2009/0195068 A1 | 8/2009 | Ohashi et al. | |
| 2013/0151919 A1* | 6/2013 | Huynh | G06F 1/26 |
| | | | 714/E11.023 |
| 2014/0028266 A1* | 1/2014 | Demetriades | H02M 7/49 |
| | | | 320/136 |
| 2014/0112039 A1 | 4/2014 | Correa Vasquez et al. | |
| 2015/0318788 A1 | 11/2015 | Kovacic et al. | |
| 2016/0065072 A1* | 3/2016 | Xiu | H02M 1/08 |
| | | | 323/271 |
| 2016/0378085 A1 | 12/2016 | Guo et al. | |

OTHER PUBLICATIONS

International Search Report dated Jun. 8, 2018.

* cited by examiner

RECHARGING CIRCUIT FOR MODULAR MULTILEVEL CONVERTERS

BACKGROUND

Field of the Invention

The present invention relates to a method and to a circuit for driving a power semiconductor switch, which is used in devices for providing an AC voltage supply, for example from a battery pack. A multi-level converter that uses the method and the circuit is also claimed.

Related Art

Currently battery packs that are usually installed in electric vehicles are hardwired units, for example, of individual battery cells. At the output, such batteries supply almost exclusively DC voltage, whereas most consumers in the electric vehicle require an AC voltage with a certain frequency, amplitude and phase. Furthermore, the DC voltage provided varies over the respective state of charge. In order to be able to supply connected consumers with the required power both at a peak voltage and at a final charge voltage, they must previously have been equipped with complex supply circuits, for example with power semiconductor switches. If a voltage required by a consumer deviates a lot from the battery voltage, a power electronics circuit causes high losses and distortions in the output voltage. In particular, this adversely affects a drive electric motor, which generally requires AC voltages with significantly lower amplitude, especially at low speeds, and also loads the insulation thereof, which shortens the service life.

A problem with battery packs is also that, due to scattering in the physical and chemical behavior of the battery cells, in order to make possible a uniform state of charge, what is known as battery management must be provided, which includes complex monitoring of the individual battery cells and, in particular, local charge exchange. Furthermore, a failure of a single battery cell usually necessitates the shutdown of the entire battery pack, since faulty battery cells can overheat and catch fire upon further loading.

US 2016/0378085 describes battery management arrangement in which the power to be provided is drawn from both a battery store and capacitors.

In contrast to traditional power electronics systems, which switch input or output voltages over between a few levels with few power semiconductor switches in order to produce a desired voltage on average, modular multi-level converters can provide a voltage in very fine steps by way of a dynamically changeable electrical configuration of energy stores arranged in modules, for example capacitors or batteries. A central multi-level converter in this sense is the modular multi-level converter MMSPC, described by S. M. Goetz, A. V. Peterchev and T. Weyh, "Modular Multilevel Converter With Series and Parallel Module Connectivity:" Topology and Control," in IEEE Transactions on Power Electronics, vol. 30, no. 1, pp. 203-215, January 2015.

US 20140028266 A1 discloses a method for supporting an AC system via a cell-based voltage source converter having an AC side connected to an AC line of the AC system and a DC side connected to a DC line of a DC transmission system and a group of phase branches between the DC poles is connected in parallel for connection to the DC transmission system, wherein the phase branches further comprise cells connected to one another in a chained manner, each cell comprises a series of switch elements in parallel with a cell capacitor, and further comprises a battery module group, which comprises at least one battery module that is able to be connected in parallel with the cell capacitor. The actual method comprises controlling the switching elements of the cells to convert AC to DC or vice versa, obtaining data regarding the power requirement of the AC system via measurements of the AC system, selecting battery module groups of a number of active cells to meet the power requirement depending on the power needed to meet the power requirement and a cell switching scheme used in the converter. The method furthermore comprises selecting cells that are active for the longest in a given time interval over those that are active for a shorter time, and connecting the selected battery module groups in parallel with corresponding cell capacitors to exchange power with the AC system.

DE 101 03 031 B4 discloses a power converter circuit with distributed energy stores and a method for controlling such a power converter circuit. The power converter circuit comprises at least two replacement three-poles, each having two branches electrically connected in series, whose positive terminals are electrically conductively connected to a positive busbar and whose negative terminals are electrically conductively connected to a negative busbar of the power converter circuit. In this case, a connection point of the two branches of each replacement three-pole electrically connected in series forms a load terminal, wherein each replacement three-pole has k two-pole subsystems electrically connected in series. Each two-pole subsystem has a unipolar storage capacitor, to which a series circuit of two controllable electronic switches is in each case electrically connected in parallel with an antiparallel-connected diode, and wherein one terminal of the unipolar storage capacitor and one connection point of these two controllable electronic switches each form a terminal point of a two-pole subsystem. The power converter circuit described can be expanded modularly to any number of stages and can also be used at high voltages.

A problem with electronic semiconductor switches, particularly in field effect transistors, abbreviated to FET, or in insulated-gate bipolar transistors, abbreviated to IGBT, illustrates the need to drive them, as a rule, relative to their own potential. If, for example, a threshold voltage is at 2 V in a FET, then a gate potential relative to a source potential must be well below this threshold for a blocking state and must be clearly above this threshold for a conducting state. This is also easy to achieve in a half-bridge commonly used in inverters, that is to say two series-connected semiconductor switches, in a so-called low-side switch, since the source of the low-side switch is generally at ground of the voltage supply of the entire power circuit. In contrast, the source potential of a so-called high-side switch corresponds to a drain potential of the low-side switch and is therefore not fixed. If the low-side switch is closed, the source potential of the high-side switch is at the same ground. However, if the low-side switch is open and the high-side switch is closed, the potential is even at the upper supply voltage of the half-bridge. If both switches are open, the potential assumes a value between the ground and the upper supply voltage, wherein the exact value is either undefined or dependent on a load, for example a motor with slow inductance, which forces a steady current flow. Since the source potential of the high-side switch can thus assume different values, the supply voltage of the gate potential must also be varied to a switch activation.

This is corrected by small, galvanically isolated DC-DC converters, which refer the ground-referenced supply voltage in a potential-shifted manner to the source potential of the high-side switch and thus provide a sliding supply voltage for the switch activation of the high-side switch. However, such converters are expensive and inefficient.

Alternatively, what is known as bootstrapping can be used. Since the high-side switches and the low-side switches are alternately activated at least at certain intervals in a half-bridge, a so-called bootstrap capacitor, but also another energy store is conceivable, can be connected to a reference point so that it is available as a short-term or medium-term supply for a high-side switch driver and is charged via a diode from the voltage supply of the low-side switch or another ground-referenced supply as soon as the low-side switch is closed. In this case, the diode prevents a backflow of energy when the low-side switch is opened again and the source potential of the high-side switch increases. For example, the source potential is used here as a reference point in the FET and an emitter potential in the case of bipolar transistors, for example IGBTs.

The supply voltage of the gate potential at the high-side switch is thus carried out via an energy store that shifts its potential and that must have a recharging option. However, especially in modular multi-level converters, there are also half-bridges with power semiconductor switches, in which bootstrapping cannot be used for circuitry reasons since a respective bootstrap capacitor would discharge again in some circuit constellations. This problem can occur especially in partitions in similar assemblies within multi-level converters in which transistors that are to be switched synchronously are advantageously combined into modules, but some of the transistors are no longer able to be driven by bootstrapping as a result.

Against this background, it is an object of the present invention to provide a method for driving a power semiconductor switch whose source potential is subject to fluctuations and in which no reference point for charging a bootstrap capacitor can be identified in terms of circuitry, without resorting to expensive and space-consuming DC-DC converters in the process. It is also an object of the present invention to provide a corresponding circuit for carrying out such a method and a multi-level converter that uses the method and the circuit.

SUMMARY

To solve the object mentioned above, a method for recharging an energy store used to drive a power semiconductor switch is claimed, wherein the energy store and the power semiconductor switch are at the same potential, wherein a switching state of the power semiconductor switch is effected by a controller, wherein the controller assigns a respective potential value to the energy store at a respective switching state and wherein, by driving at least one charging switch, charging of the energy store is activated as soon as the potential value of the energy store corresponds to a ground potential of a supply voltage.

For the control according to the invention, it is important when the latter occurs, that is to say the potential value of the energy store corresponds to a ground potential of the supply voltage, or a time when a respective potential value of the energy store changes relative to a value of the ground potential of the supply voltage. However, this time is known to the controller, for example in the case of a modular multi-converter, exactly from the respective switching state that the controller itself effects.

In one embodiment of the method according to the invention, by driving the at least one charging switch, draining of charge from the energy store is prevented as soon as the potential of the power semiconductor switch is not at the ground potential of the supply voltage. As well as the time for closing the at least one charging switch, the controller also knows the time for opening the respective charging switch from the respective switching state effected by said controller itself.

In a further embodiment of the method according to the invention, the controller controls the respective switching states of a plurality of power semiconductor switches. A realization of a respective switching state, which is prescribed to the controller, for example, by way of an algorithm, results in a respective potential value at a source or emitter input of a power semiconductor switch that is acted upon by driving according to the method according to the invention and that is known to the controller in respect of a value of the ground potential of the supply voltage.

In another further embodiment of the method according to the invention, the power semiconductor switches are installed in a modular multi-level converter and are assigned to respective modules within the modular multi-level converter, wherein the switching states of the power semiconductor switches of each module are selected according to a respective predetermined module state, and wherein at least one power semiconductor switch of a respective module is driven by means of a respective energy store assigned to a respective power semiconductor switch. By virtue of a modularization of the plurality of power semiconductor switches, which is advantageous for circuitry reasons, that is to say by virtue of a specific assignment of respective power semiconductor switches to respective modules and a specific arrangement of the respective power semiconductor switches within a module, for example when the power semiconductor switches suitably combined in one module are to have synchronous switching states, it can occur that individual power semiconductor switches within a module are no longer able to be driven by bootstrapping known from the prior art. In order to avoid a circuit with a complex DC-DC converter, the method according to the invention can be used for these power semiconductor switches.

In one embodiment of the method according to the invention, a bootstrap capacitor is selected as the energy store. Other energy stores, such as a battery for example, are conceivable.

In a further embodiment of the method according to the invention, the at least one charging switch is designed to be able to block a maximum voltage occurring in the circuit. This may correspond to a double power voltage of a module capacitor, that is to say another energy store located in a respective module.

Furthermore, a circuit for recharging an energy store used to drive a power semiconductor switch is claimed, which has at least one power semiconductor switch, at least one energy store, at least one charging switch and a controller, wherein the circuit is configured to perform a method as described above.

In one configuration of the circuit according to the invention, the at least one energy store is formed by a bootstrap capacitor.

In a further configuration of the circuit according to the invention, the circuit has a level shifter, which is used to carry out potential shifts of signals of the controller in order to shift the potential of a respective signal to the potential reference of the respective charging switch or power semiconductor switch to be driven.

Finally, a multi-level converter provided with the circuit according to the invention is claimed, which is designed to perform the method according to the invention.

Further advantages and configurations of the invention emerge from the description and from the appended drawings.

It is understood that the features mentioned above and the features yet to be discussed below may be used not only in the respectively specified combination but also in other combinations or individually without departing from the scope of the present invention.

The figures are described cohesively and comprehensively and the same components are assigned the same reference symbols.

DETAILED DESCRIPTION

Figure 1:
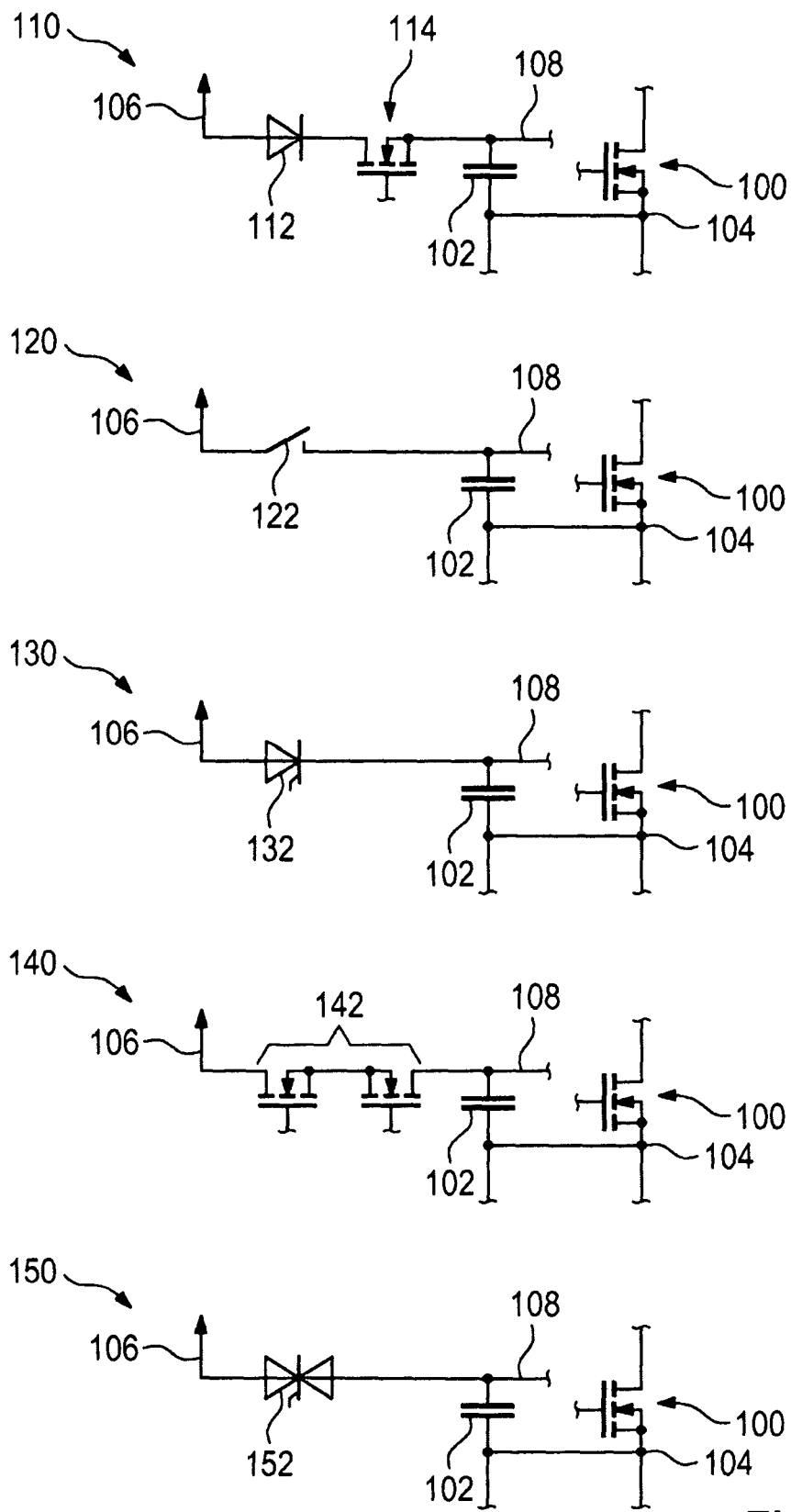
FIG. 1 shows a schematic illustration of exemplary circuits for realizations of a charging switch for an energy store that are configured according to the method according to the invention.

FIG. 1 shows a schematic illustration of exemplary circuits 110, 120, 130, 140, 150 for realizations of a charging switch for an energy store 102 that are configured according to the method according to the invention. A source/emitter terminal 104 of the power semiconductor switch 100 to be driven is connected to a terminal of the energy store 102, the other terminal of which on the one hand has a charging switch with a supply voltage 106, which has a potential different from the potential of the source/emitter terminal 104, on the other hand represents a supply 108 for the power semiconductor switch or the driver thereof. The circuit 110 having a charging switch consisting of a diode 112 and a field-effect transistor 114, abbreviated to FET, has the advantage that the FET has to block only a drain-source voltage of the power semiconductor switch 100 to be driven minus a gate voltage of the power semiconductor switch 100 in a switched-on state, while the diode 112, however, has to block the full drain-source voltage of the power semiconductor switch to be driven. Further exemplary realizations of the charging switch are formed in the circuit 120 by way of a simple switch 122, in the circuit 130 by way of a thyristor 132, in the circuit 140 by way of a bidirectional FET switch 142, and in the circuit 150 by way of a bidirectional thyristor triode 152. Other implementations of the charging switch are also conceivable.

Figure 2:
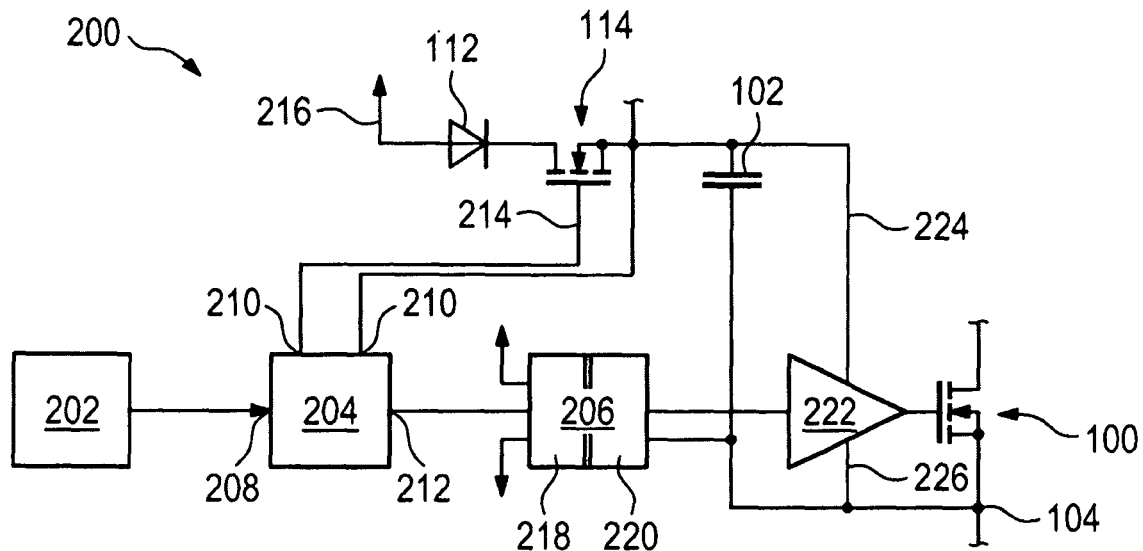
FIG. 2 shows a schematic illustration of an exemplary circuit for driving a charging switch and a power semiconductor switch according to an embodiment of the method according to the invention.

FIG. 2 shows a schematic illustration of an exemplary circuit 200 for driving a charging switch 112, 114 and a power semiconductor switch 100 according to an embodiment of the method according to the invention. To recharge the energy store 102, the charging switch 112, 114 requires specific switching signals 210 from a controller 204, which indicates that the potential at a source of the FET 114 or, for example, at an emitter in the case of bipolar transistors such as IGBTs, is at a potential of the supply voltage with which the energy store 102 is to be recharged. The controller 204, which consists of a module controller or an electronics system, can make a statement about potential values present in the circuit 200 since it receives from a status module 202 state information 208 about circuit states of all the present power semiconductor switches whose respective circuit state influences the potential values. Furthermore, the controller 204 generates specific switching signals 212 for the power semiconductor switch 100. Depending on the driving potential 214 applied to the FET 114, the charging switch 112, 114 then switches on a supply voltage 216 referred to the ground potential to the energy store 102. For the specific switching signals 212 for the power semiconductor switch 100, a level shifter 206 may be necessary. The level shifter 206 shifts the potential, which is applied to the input side 218, of the switching signals 212 with potential reference to the controller 204 to the potential reference of the source/emitter output 104 of the power semiconductor switch 100. Said level shifter may be integrated together with a gate driver 222 following the output side 220 thereof. The gate driver 222 is fed with a positive supply 224 and a negative supply 226, receives a logic input signal and switches an output with a comparatively high power or high current. An energy supply on the input side 218 is preferably effected via the same potential as that of the controller 204.

Figure 3:
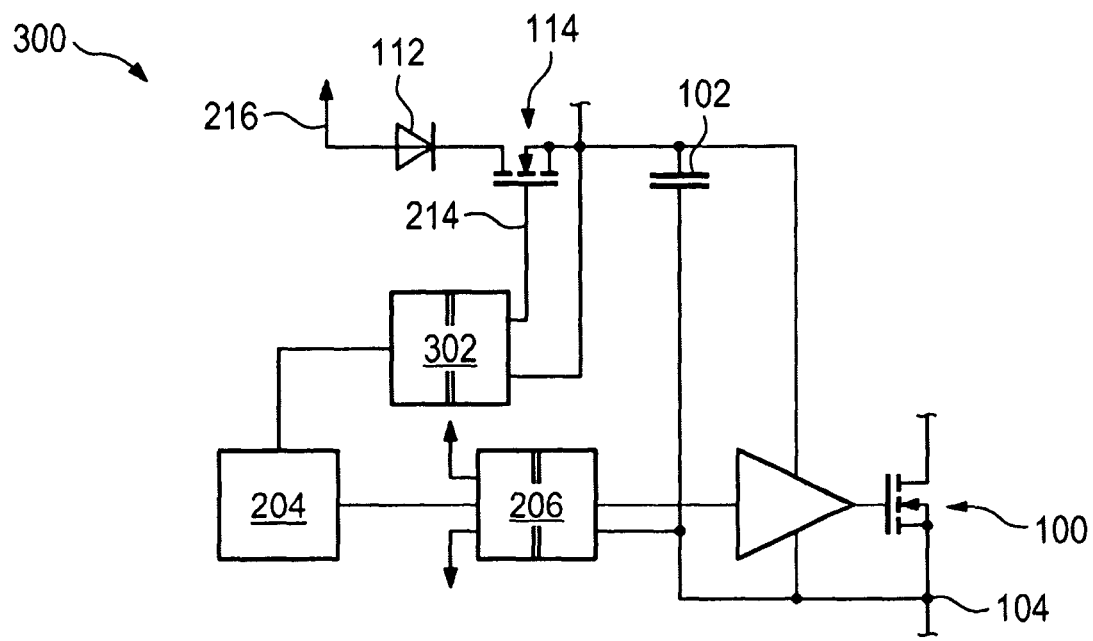
FIG. 3 shows a schematic illustration of an exemplary circuit having a level shifter according to a further embodiment of the method according to the invention.

FIG. 3 shows a schematic illustration of an exemplary circuit 300 having a level shifter 302 according to a further embodiment of the method according to the invention. Since a drive potential 214 of the FET 114 is at a different potential than that of the controller 204, it may be necessary to shift a specific switching signal 210, which is generated by the controller 204 at the potential thereof, by way of a level shifter 302 to a potential level of the FET 114. It is also conceivable to use an optocoupler or a signal isolator for this purpose. In any case, an expensive gate driver does not necessarily have to be used since a small-signal transistor is sufficient for the charging switch and no further power semiconductor switch has to be used for this purpose.

Figure 4:
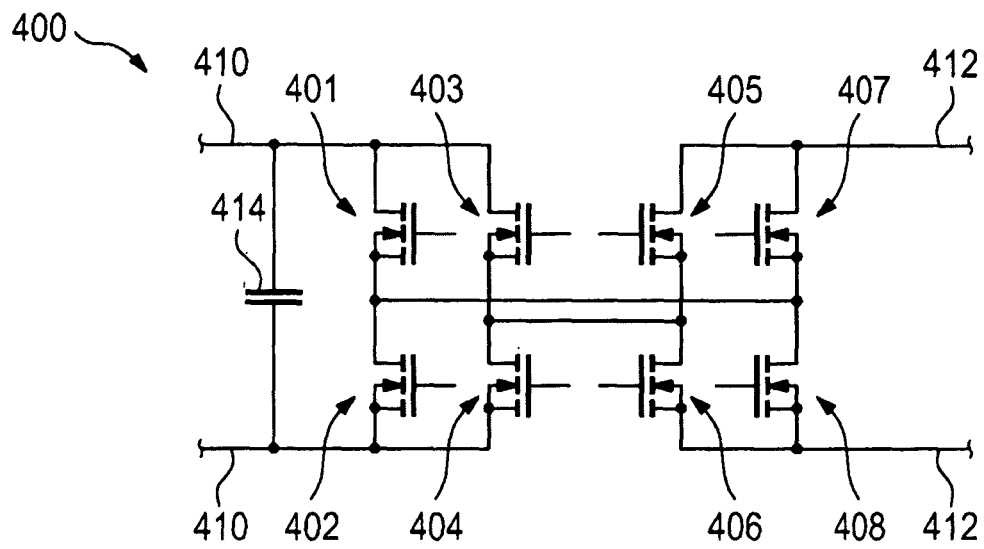
FIG. 4 shows a schematic illustration of an exemplary circuit of a four-quadrant module of a multi-level converter.

FIG. 4 shows a schematic illustration of an exemplary circuit 400 of a four-quadrant module of a multi-level converter. A total of eight power semiconductor switches 401, 402, 403, 404, 405, 406, 407, 408 were combined in the four-quadrant module in such a way that a likewise installed module capacitor 414 on the left side lies directly between the terminals 410. On the right side of the four-quadrant module are two further terminals 412. In such a module construction, the power semiconductor switches 405 and 407 may be driven or recharged via bootstrapping known from the prior art because the power semiconductor switches 404 and 402 can at least temporarily bring down a source/emitter potential of 405 and 407 to a level of the ground potential of 402 and 404 and the source/emitter potential of 405 and 407 can never fall below this. Accordingly, a bootstrap diode is sufficient for charging a respectively associated bootstrap capacitor. In contrast, the power semiconductor switches 406 and 408 are not driven by bootstrapping known from the prior art and the method according to the invention is used to avoid a circuit with a complex DC-DC converter, that is to say a circuit according to the method according to the invention, for example circuit 300, is formed at the power semiconductor switches 406 and 408, wherein the power semiconductor switches 406 and 408 are respectively identified with the power semiconductor switch 100. It is also conceivable to carry out the method according to the invention for the power semiconductor switches 406 and 408 with a common energy store 102. The knowledge about the module state from a respective switching state of the power semiconductor switches necessary for the control is described, for example, in the prior art in S. M. Goetz, A. V. Peterchev and T. Weyh, "Modular Multilevel Converter With Series and Parallel Module Connectivity: Topology and Control," in IEEE Transactions on Power Electronics, vol. 30, no. 1, pp. 203-215, January 2015. This results in the following table for the recharging possibility of the respective energy store for the power semiconductor switches 406 and 408, referred to as "charging", depending on a respective module interconnection, referred to as "interconnection type", and on a respective switching state of the power semiconductor switches of the module, referred to as "activated switch".

| Interconnection type | Activated switch | Charging |
|---|---|---|
| Positive series | 401, 403, 406, 408 | off |
| Negative series | 402, 404, 405, 407 | off |
| Parallel A | 401, 404, 406, 407 | on |
| Parallel B | 402, 403, 405, 408 | on |
| Bypass A | 402, 404, 406, 408 | on |
| Bypass B | 401, 403, 405, 407 | off(*) |
| None | none | off |

Note on (*): In the case of the "Bypass B" type of interconnection, it would nevertheless be possible to charge when a voltage at the adjacent module capacitor has a value similar to that of the supply voltage used for charging.

Figure 5:
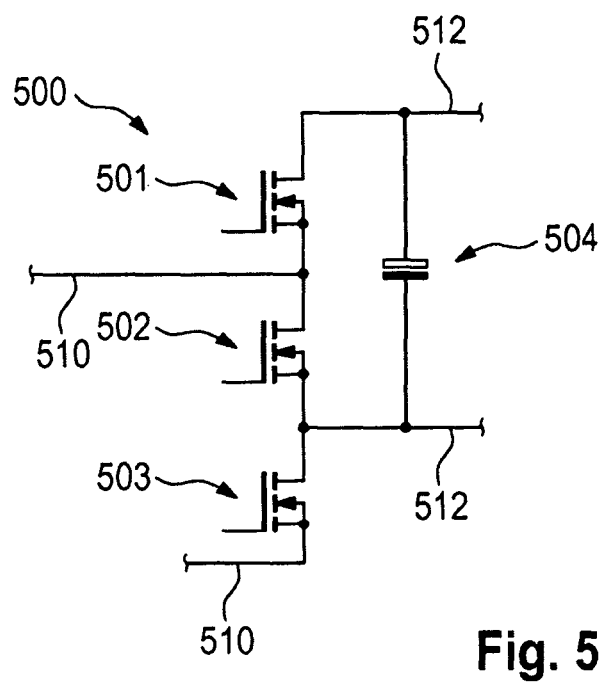
FIG. 5 shows a schematic illustration of an exemplary circuit of a three-quadrant module of a multi-level converter.

FIG. 5 shows a schematic illustration of an exemplary circuit 500 of a three-quadrant module of a multi-level converter. A total of three power semiconductor switches 501, 502, 503 were combined in the three-quadrant module in such a way that a likewise installed module capacitor 504 on the right side lies directly between the terminals 512. On the left side of the three-quadrant module are two further terminals 510. In such a module structure, the power semiconductor switch 503, for example, is not driven by bootstrapping known from the prior art and the method according to the invention is used, that is to say a respective circuit according to the method according to the invention, for example circuit 300, is formed at the power semiconductor switch 503, wherein the power semiconductor switch 503 is identified with the power semiconductor switch 100. This results in the following table for the recharging possibility of the energy store for the power semiconductor switch 503, referred to as "charging", depending on a respective module interconnection, referred to as "interconnection type", and on a respective switching state of the power semiconductor switches of the module, referred to as "activated switch".

| Interconnection type | Activated switch | Charging |
|---|---|---|
| Positive series | 502(**) | off |
| Bypass | 503 | on |
| Parallel | 501 and 503 | on |
| None | none | off |

Note on (**): In this case, it depends on the length of the intended series circuit.

Figure 6:
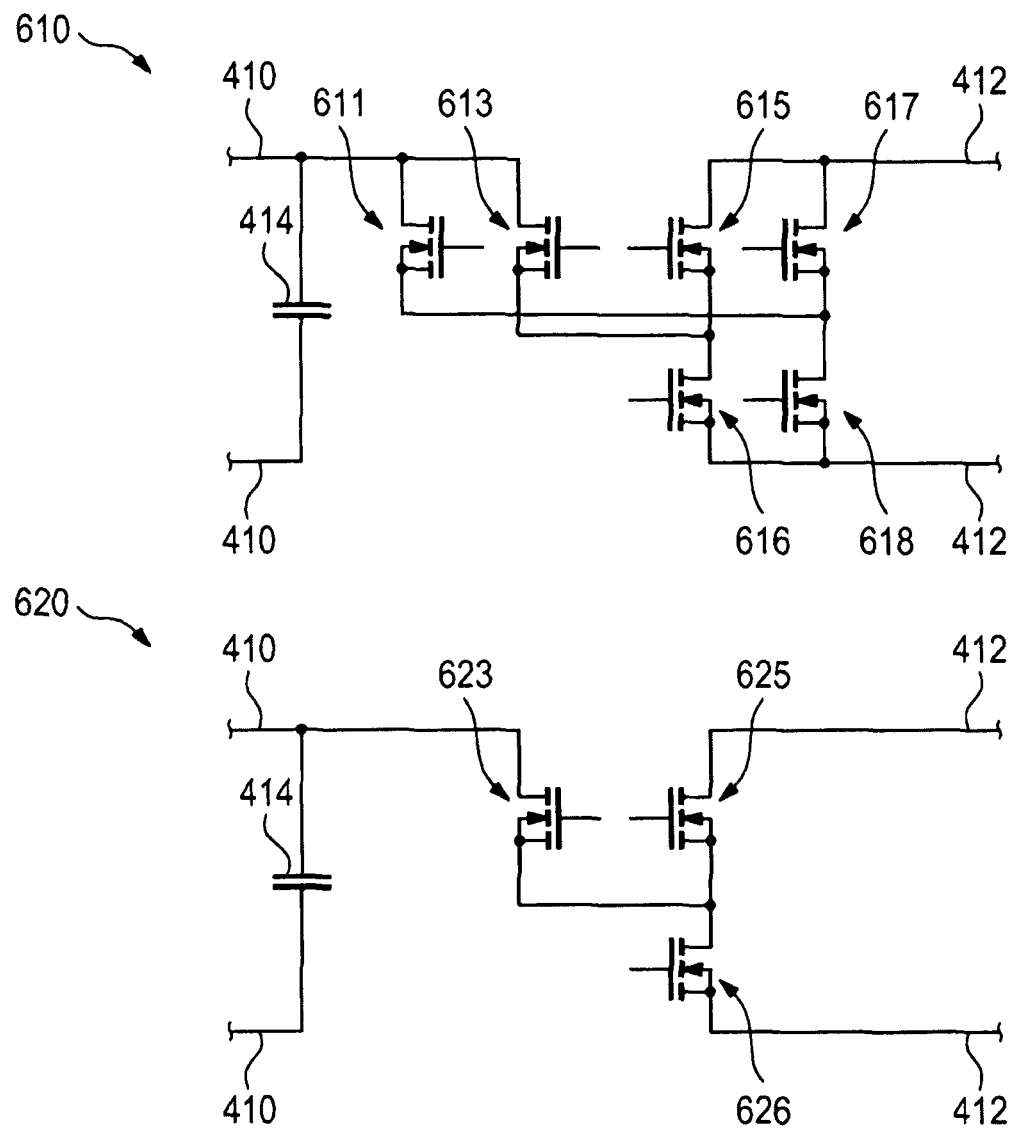
FIG. 6 shows a schematic illustration of exemplary circuits having a plurality of power semiconductor switches, which are driven by means of a still further embodiment of the method according to the invention.

FIG. 6 shows a schematic illustration of exemplary circuits 610 and 620 having a plurality of power semiconductor switches, which are driven by means of a still further embodiment of the method according to the invention. In the circuit 610, the inventive method is performed at the power semiconductor switches 616 and 618, in the circuit 620 at the power semiconductor switch 626. In comparison to the circuit 400, however, the power semiconductor switches 402 and 404 are missing, with the result that now also the power semiconductor switches 615 and 617 are no longer able to be driven with bootstrapping from the prior art. However, a bootstrap supply, for example in conjunction with a diode or an additional circuit according to the method according to the invention, can take place from an energy store 102, which is respectively jointly connected to 616 or to 618 or to both. In the circuit 620, the method according to the invention is performed at the power semiconductor switch 626. In comparison to the circuit 400, however, the power semiconductor switches 401, 402, 404 and 408 are missing, with the result that now the power semiconductor switch 625 is no longer able to be driven with bootstrapping from the prior art. However, a bootstrap supply, for example in conjunction with a diode or an additional circuit according to the method according to the invention, for example as shown in FIG. 7, can take place from an energy store 102, which is connected to 626.

Figure 7:
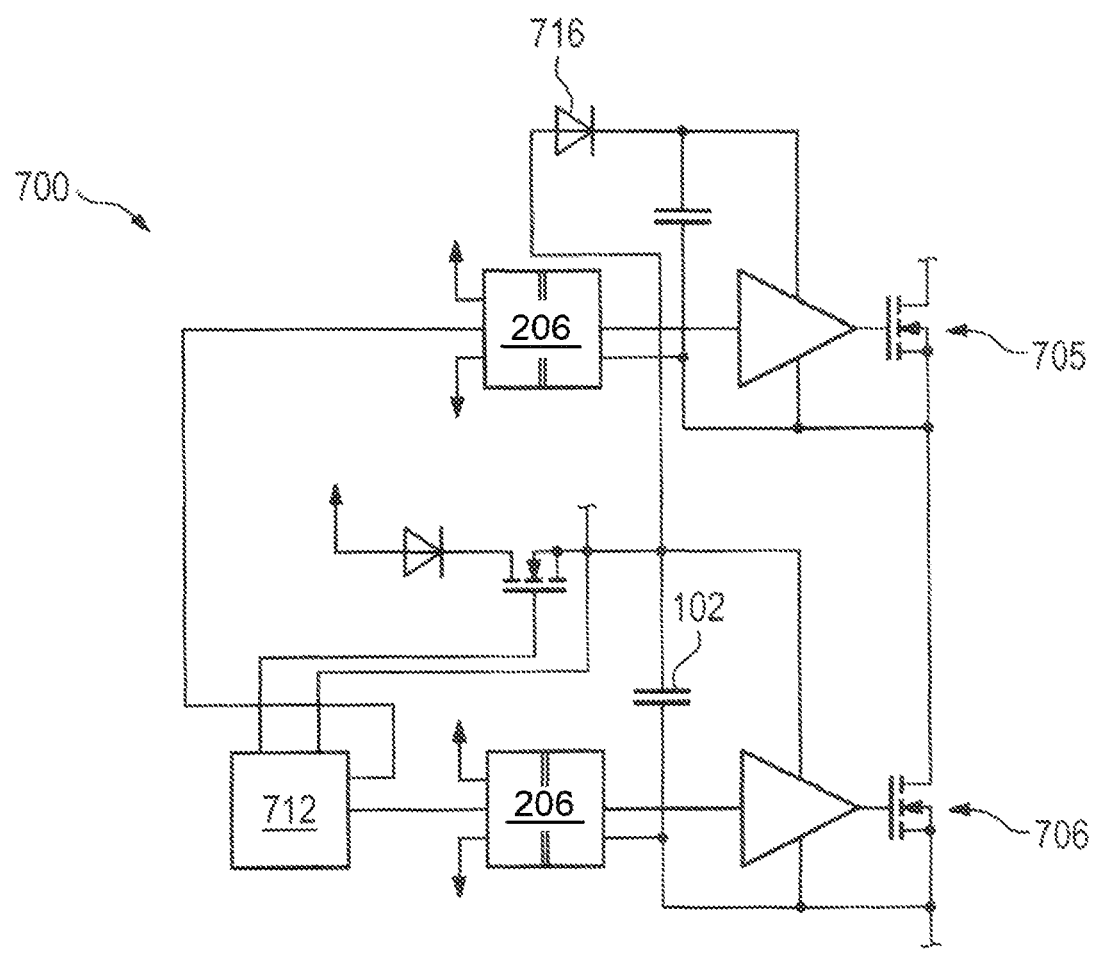
FIG. 7 shows a schematic illustration of an exemplary circuit for driving a further power semiconductor switch by means of a further embodiment of the method according to the invention.

FIG. 7 shows a schematic illustration of an exemplary circuit 700 for driving a further power semiconductor switch 705 by means of a further embodiment of the method according to the invention. The method according to the invention is carried out at the power semiconductor switch 706. It is then possible, by way of the illustrated circuit 700, to achieve a bootstrap supply for the power semiconductor switch 705 from the driving of the power semiconductor switch 706 according to the invention. The connection to the energy store 102 is effected here via a diode 716. The control module 712 from the implementation of the method according to the invention also takes over the control of the power semiconductor switch 705.

The invention claimed is:

1. A method for recharging an energy store (102) used to drive a power semiconductor switch (100), wherein a negative terminal of the energy store (102) and a source/emitter terminal of the power semiconductor switch (100, 406, 408, 503, 616, 618, 626, 706) are connected to one another and a potential of the negative terminal of the energy store (102) is at times temporarily lower than a ground potential (106, 216) of a supply voltage, wherein a switching state of the power semiconductor switch (100, 406, 408, 503, 616, 618, 626, 706) is effected by a controller (204, 712) that jointly controls the power semiconductor switch (100) and at least one charging switch (112, 114, 122, 132, 142, 152) to recharge of the energy store (102), wherein the controller (204, 712) determines the respective potential value at the negative terminal of the energy store (102) based on a respective switching state (202) of the power semiconductor switch (100, 406, 408, 503, 616, 618, 626, 706) and wherein, by driving the at least one charging switch (112, 114, 122, 132, 142, 152) that turns on the supply voltage to the energy store (102), charging of the energy store (102) is activated as soon as the potential value of the negative terminal of the energy store (102) corresponds to the ground potential (106, 216) of the supply voltage.

2. The method of claim 1, wherein, by driving the at least one charging switch (112, 114, 122, 132, 142, 152), draining of charge from the energy store (102) is prevented as soon as the potential of the source/emitter terminal of the power semiconductor switch (100, 406, 408, 503, 616, 618, 626, 706) is not at the ground potential (106, 216) of the supply voltage.

3. The method of claim 2, wherein the energy store (102) is selected as a bootstrap capacitor.

4. The method of claim 3, wherein the controller (204, 712) controls the respective switching states (202) of a plurality of power semiconductor switches (100, 406, 408, 503, 616, 618, 626, 706) and a potential value of the energy store (102) is assigned to a respective realization of the switching states of the plurality of power semiconductor switches (100, 406, 408, 503, 616, 618, 626, 706).

5. The method of claim 4, wherein the power semiconductor switches (100, 401, 402, 403, 404, 405, 406, 407, 408, 501, 502, 503, 611, 613, 615, 616, 617, 618, 623, 625, 626, 705, 706) are installed in a modular multi-level converter and respectively assigned to respective modules within the modular multi-level converter, wherein the switching states (202) of the power semiconductor switches (100, 401, 402, 403, 404, 405, 406, 407, 408, 501 , 502, 503, 611, 613, 615, 616, 617, 618, 623, 625, 626, 705, 706) of each module are selected according to a respective predetermined module state, and wherein at least one power semiconductor switch (100, 406, 408, 503 , 616, 618, 626, 706) is driven by means of an energy store (102) assigned to the at least one power semiconductor switch (100, 406, 408, 503, 616, 618, 626, 706).

6. The method of claim 5, wherein the at least one charging switch (112, 114, 122, 132, 142, 152) is designed to be able to block a maximum voltage occurring in the circuit comprising the at least one power semiconductor switch (100, 406, 408, 503, 616, 618, 626, 706).

7. The method of claim 1, wherein the energy store (102) is selected as a bootstrap capacitor.

8. The method of claim 1, wherein the controller (204, 712) controls the respective switching states (202) of a plurality of power semiconductor switches (100, 406, 408, 503, 616, 618, 626, 706) and a potential value of the energy store (102) is assigned to a respective realization of the switching states of the plurality of power semiconductor switches (100, 406, 408, 503, 616, 618, 626, 706).

9. The method of claim 8, wherein the power semiconductor switches (100, 401, 402, 403, 404, 405, 406, 407, 408, 501, 502, 503, 611, 613, 615, 616, 617, 618, 623, 625, 626, 705, 706) are installed in a modular multi-level converter and respectively assigned to respective modules within the modular multi-level converter, wherein the switching states (202) of the power semiconductor switches (100, 401, 402, 403, 404, 405, 406, 407, 408, 501 , 502, 503, 611, 613, 615, 616, 617, 618, 623, 625, 626, 705, 706) of each module are selected according to a respective predetermined module state, and wherein at least one power semiconductor switch (100, 406, 408, 503 , 616, 618, 626, 706) is driven by means of an energy store (102) assigned to the at least one power semiconductor switch (100, 406, 408, 503, 616, 618, 626, 706).

10. The method of claim 1, wherein the at least one charging switch (112, 114, 122, 132, 142, 152) is designed to be able to block a maximum voltage occurring in the circuit comprising the at least one power semiconductor switch (100, 406, 408, 503, 616, 618, 626, 706).

11. A circuit (110, 120, 130, 140, 150, 200, 300, 700) for recharging an energy store (102) used to drive a power semiconductor switch (100, 406, 408, 503, 616, 618, 626, 706), which has at least one power semiconductor switch (100, 406, 408, 503, 616, 618, 626, 706), at least one energy store (102), at least one charging switch (112, 114,122, 132, 142, 152) and a controller (204, 712) and is configured to perform the method of claim 1.

12. The circuit (110, 120, 130, 140, 150, 200, 300, 700) of claim 11, wherein the at least one energy store (102) is formed by a bootstrap capacitor.

13. The circuit (110, 120, 130, 140, 150, 200, 300, 700) of claim 11, further comprising a level shifter (206, 302) that shifts the potential of a respective signal from the controller to the potential reference of the respective charging switch or power semiconductor switch to be driven.

14. A multi-level converter that comprises the circuit of claim 11.

* * * * *